(12) United States Patent
Morimoto et al.

(10) Patent No.: US 10,231,348 B2
(45) Date of Patent: Mar. 12, 2019

(54) HEAT DISSIPATION STRUCTURE FOR CONNECTOR MODULE

(71) Applicant: YAZAKI CORPORATION, Tokyo (JP)

(72) Inventors: Mitsuaki Morimoto, Shizuoka (JP); Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/138,003

(22) Filed: Apr. 25, 2016

(65) Prior Publication Data

US 2016/0353563 A1 Dec. 1, 2016

(30) Foreign Application Priority Data

May 28, 2015 (JP) .................................. 2015-108588
Jun. 11, 2015 (JP) .................................. 2015-117997

(51) Int. Cl.
| | | |
|---|---|---|
| *H05K 5/00* | (2006.01) | |
| *B60L 11/18* | (2006.01) | |
| *H01R 31/06* | (2006.01) | |
| *H01R 13/74* | (2006.01) | |

(52) U.S. Cl.
CPC ........ *H05K 5/0026* (2013.01); *B60L 11/1818* (2013.01); *H01R 31/065* (2013.01); *B60L 2240/36* (2013.01); *H01L 2224/4903* (2013.01); *H01R 13/74* (2013.01); *Y02T 10/7005* (2013.01); *Y02T 10/7072* (2013.01); *Y02T 90/14* (2013.01)

(58) Field of Classification Search
CPC .............................. H05K 5/0026; H02M 7/003
USPC ...... 361/715, 730, 752, 797; 174/521, 50.52
See application file for complete search history.

(56) References Cited

U.S. PATENT DOCUMENTS

| | | | |
|---|---|---|---|
| 4,495,651 A | 1/1985 | Froeliger | |
| 5,212,627 A * | 5/1993 | No | H01L 25/165 165/80.3 |
| 6,441,520 B1 * | 8/2002 | Grant | H01L 25/16 174/252 |
| 6,522,528 B2 * | 2/2003 | Yamane | B60R 16/0238 361/601 |
| 6,560,115 B1 | 5/2003 | Wakabayashi et al. | |
| 6,924,985 B2 * | 8/2005 | Kawakita | H05K 7/20854 257/711 |

(Continued)

FOREIGN PATENT DOCUMENTS

| | | |
|---|---|---|
| CN | 101434254 A | 5/2009 |
| CN | 102248963 B | 8/2013 |

(Continued)

OTHER PUBLICATIONS

Japanese Office Action for the related Japanese Patent Application No. 2015-117997 dated Apr. 18, 2017.

(Continued)

*Primary Examiner* — Mukundbhai G Patel
(74) *Attorney, Agent, or Firm* — Kenealy Vaidya LLP

(57) ABSTRACT

A connector module is provided with first and second bus bars which are respectively formed by a metal plate, a control board on which an electronic component is mounted, and case member which is formed by insulative resin and houses the control board therein. Connector parts to be connected with respective counterpart connectors are integrally formed with the case member.

3 Claims, 11 Drawing Sheets

(56) References Cited

U.S. PATENT DOCUMENTS

| | | | |
|---|---|---|---|
| 6,986,679 | B1 | 1/2006 | Aronson et al. |
| 7,349,227 | B2 * | 3/2008 | Kashiwazaki ...... B60R 16/0239 |
| | | | 174/50.52 |
| 7,667,971 | B2 * | 2/2010 | Tominaga ............ B62D 5/0406 |
| | | | 361/706 |
| 2002/0141143 | A1 | 10/2002 | Yamane |
| 2003/0086246 | A1 | 5/2003 | Inakabayashi et al. |
| 2005/0239342 | A1 | 10/2005 | Moriyama et al. |
| 2007/0093090 | A1 | 4/2007 | Fujimaki |
| 2008/0278918 | A1 | 11/2008 | Tominaga et al. |
| 2009/0122489 | A1 | 5/2009 | Tominaga et al. |
| 2011/0228498 | A1 | 9/2011 | Kawai et al. |
| 2011/0285225 | A1 | 11/2011 | Matsuda et al. |
| 2014/0148019 | A1 | 5/2014 | Sasaki et al. |

FOREIGN PATENT DOCUMENTS

| | | |
|---|---|---|
| CN | 103840284 A | 6/2014 |
| JP | 1-235883 A | 9/1995 |
| JP | 08-046649 A | 2/1996 |
| JP | 2000-323848 A | 11/2000 |
| JP | 2002-293201 A | 10/2002 |
| JP | 2002-293202 A | 10/2002 |
| JP | 2005-327855 A | 11/2005 |
| JP | 2009-99677 A | 5/2009 |
| JP | 2011-198985 A | 10/2011 |
| JP | 2011-250570 A | 12/2011 |
| JP | 2012-151066 A | 8/2012 |
| JP | 2014-107114 A | 6/2014 |

OTHER PUBLICATIONS

Japanese Office Action for the related Japanese Patent Application No. 2015-117997 dated Sep. 5, 2017 with its English translation.
Chinese Office Action for the related Chinese Patent Application No. 201610371354.6 dated May 3, 2018 with is English translation.
Japanese Office Action for the related Japanese Patent Application No. 2015-108588 dated Apr. 3, 2018 with is English translation.

* cited by examiner

HEAT DISSIPATION STRUCTURE FOR CONNECTOR MODULE

CROSS REFERENCE TO RELATED APPLICATIONS

This application claims priority from Japanese Patent Application No. 2015-108588 filed on May 28, 2015, and Japanese Patent Application No. 2015-117997 filed on Jun. 11, 2015, the entire contents of which are incorporated herein by reference.

BACKGROUND OF THE INVENTION

Field of the Invention

The present invention relates to a heat dissipation structure for a connector module.

Description of Related Art

In a module which includes a control board mounting connectors and electronic components thereon and a metal case housing the control board therein in a sliding manner, there has been proposed a heat dissipation structure which is provided with a projection protruding inside the metal case so as to be close to the electronic components. In this heat dissipation structure, as heat generated from the electronic components can be released to the ambient air via the projection of the metal case, heat dissipation property can be improved (see a patent literature 1: JP-A-2011-198985).
[Patent Literature 1] JP-A-2011-198985

However, in the heat dissipation structure described in the patent literature 1, heat is released from the metal case having such a degree of size capable of hosing the control board. Thus, if an amount of heat generation becomes large like such a case where the module is arranged on a path flowing a large current, heat dissipation performance is not sufficient and hence improvement of the heat dissipation performance is desired. Further, in the heat dissipation structure described in the patent literature 1, as the control board is assembled in the metal case in the sliding manner, the control board is likely damaged. Further, as the control board is directly attached to the metal case, a probability of short circuit of the control board is high.

SUMMARY

One or more embodiments provide a heat dissipation structure for a connector module which can improve heat dissipation performance and reduce probabilities of damage and short-circuit of a control board while suppressing increase in number of parts and assembling processes and downsizing.

In an aspect (1), one or more embodiments provide a connector module provided with first and second bus bars which are respectively formed by a metal plate, a control board on which an electronic component is mounted, a case member which is formed by insulative resin and houses the control board therein. Connector parts to be respectively connected with counterpart connectors are integrally formed with the case member.

In an aspect (2), preferably the connector module is further provided with a semiconductor element which is arranged between the first and second bus bars and controlled to be turned on/off for conducting/interrupting between the first and second bus bars, and a signal input terminal which is provided on the control board and receives a control signal instructing turning-on/off of the semiconductor element. The control board transmits an on/off signal to a control electrode of the semiconductor element so as to turn on/off the semiconductor element. The case member houses at least the semiconductor element and the control board and partially exposes each of the first and second bus bars and the signal input terminal. The connector parts are integrally formed with the case member in a manner of respectively covering exposed circumferential peripheries of the first and second bus bars and the signal input terminal.

According to the aspect (2), the case member partially exposes each of the first and second bus bars and the signal input terminal and the connector parts are integrally formed with the case member in a manner of respectively covering exposed parts, so that it is possible to suppress increase in number of parts and assembling processes. Furthermore, even if a large current is flown into the connector module, the large current is not flown into the control board. So it is not needed that large space of the control board and a location part of a large type connector on the control board are assured. Therefore, it is possible to suppress increase in number of parts and assembling processes and to downsize.

In an aspect (3), preferably the first and second bus bars are exposed in the same direction, and the connector parts covering the exposed circumferential peripheries of the first and second bus bars are inserted in an exposed direction into connector reception parts to be connected with the connector parts, and extracted in a direction opposite to the exposed direction from the connector reception parts.

According to the aspect (3), exposed directions of the first and second bus bars are the same direction, and the connector parts covering the exposed circumferential peripheries of the first and second bus bars are inserted in the exposed direction into connector reception parts and extracted in a direction opposite to the exposed direction from the connector reception parts so that the connector module may be used as a service plug for high voltage battery, such as EV and PHV.

In an aspect (4), preferably a heat dissipation structure for a connector module is provided with a connector module including a control board which mounts an electronic component configured by packaging a heat generation element, the case member which is formed by insulative resin and houses the control board therein, and connector parts to be respectively connected with counterpart connectors, and a metal member which has a surface area larger than a surface area of the connector module and includes a module fixing part in which the connector module is inserted and fixed. The connector module includes a heat dissipation part which is formed by exposing a part of the electronic component from the case member or formed by a wall of the case member which is in contact with the electronic component, and the heat dissipation part is in contact with an inner wall of the module fixing part directly or via a heat conductive member.

According to the aspect (4), the connector module includes the heat dissipation part which is formed by exposing a part of the electronic component from the case member or formed by the wall of the case member contacting the electronic component, and the heat dissipation part contacts the inner wall of the module fixing part directly or via the heat conductive member. By doing so, heat generated from the electronic component is transferred to the module fixing part via the heat dissipation part of the connector module. As the module fixing part is a part of the metal member having the surface area larger than that of the connector module, the heat generated from the electronic component reaches the metal member via the heat dissipation part and the module fixing part and is released from the metal member having the large surface area. In this manner, as the heat generated from the electronic component is released from the metal member having the large surface area, heat dissipation performance can be improved. As the control board is housed within the case member formed by the insulative resin, the control board is unlikely damaged regardless of whether or not the control board is housed in a sliding manner. Further, as the case member is not formed by metal, a probability of short circuit of the control board can be reduced. Accordingly, the heat dissipation structure for the connector module, in which the control board is unlikely damaged and the probability of short circuit of the control board can be reduced, can be provided.

In an aspect (5), in the heat dissipation structure a heat radiation fin is preferably formed on the module fixing part.

According to the aspect (5), in the heat dissipation structure for the connector module, as the module fixing part is provided with the heat radiation fin, as heat transferred to the module fixing part from the electronic component is also released from the heat radiation fin. Thus, the heat dissipation performance can be further improved.

In an aspect (6), in the heat dissipation structure, preferably, the connector parts are integrally formed with each outer wall of the case member in a protrusive manner therefrom, respectively. Further, preferably, one end side of each of the first and second bus bars, opposite the other end side thereof molded by the resin member, is exposed from the case member and acts as a terminal of corresponding one of the connector parts.

According to the aspect (6), in the heat dissipation structure for the connector module, the electronic component includes the first and second bus bars, and also includes, as the heat generation element, the semiconductor element which is arranged between the first and second bus bars and conducts/interrupts between the first and second bus bars by being on/off controlled in response to the signal from the control board. Further, the semiconductor element is packaged by the resin member which molds the semiconductor element and parts of the first and second bus bars. Furthermore, the connector parts are integrally formed with outer walls of the case member in the protrusive manner therefrom, respectively. In addition, the one end side of each of the first and second bus bars, opposite the other end side thereof molded by the resin member, is exposed from the case member and acts as the terminal of corresponding one of the connector parts. Due to this configuration, each of the bus bars as the members capable of coping with the large current can be used as the terminal. Further, due to this construction, as the large current does not flow in the control board and hence it is not necessary to secure a large space for the board, the heat dissipation structure for the connector module capable of coping with the large current and realizing miniaturization can be provided.

According to one or more embodiments, a heat dissipation structure for a connector module can be provided which can improve heat dissipation performance and reduce probabilities of damage and short-circuit of a control board.

DETAILED DESCRIPTION

Exemplary embodiments are described below with reference to the drawings.

Figure 1:
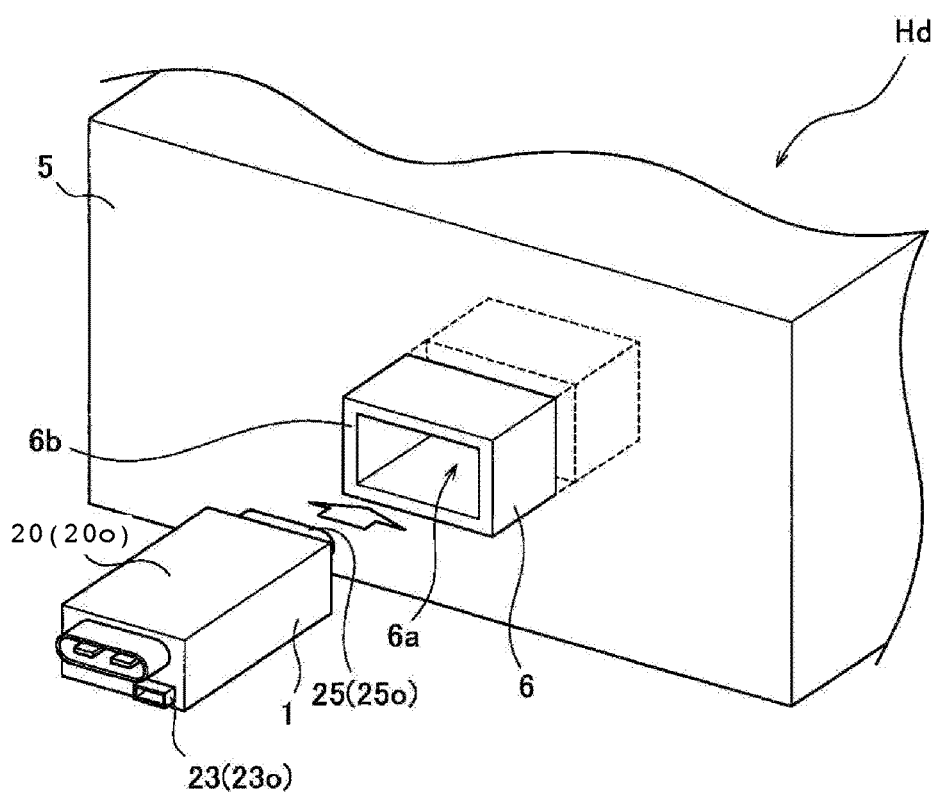
FIG. 1 is a perspective view illustrating a heat dissipation structure for a connector module according to the first embodiment of the invention.

FIG. 1 is a perspective view illustrating a heat dissipation structure for a connector module according to the first embodiment of the invention. As shown in FIG. 1, the heat dissipation structure Hd for the connector module 1 is constituted of the connector module 1 and a metal case (metal member) 5. The connector module 1 is provided, for example, on a path flowing a large current and contains heat generation elements (see a reference numeral 11c explained later). The metal case 5 is, for example, a battery case for a high-voltage battery mounted in a vehicle.

A module fixing part 6, in which the connector module 1 is inserted and fixed, is formed at this metal case 5. As shown in FIG. 1, the module fixing part 6 is constituted of a rectangular opening 6a and a frame member 6b. The frame member extends vertically from one surface of the metal case 5, where the opening 6a is formed, and is configured to surround a circumferential periphery of the opening 6a. As a size of the opening 6a is set so as to be substantially same as an external size of the connector module 1, the connector module 1 is inserted and fixed in the module fixing part 6. The module fixing part 6 is not limited to this configuration, but may have an engagement means which engages with the connector module 1 so that the connector module 1 is inserted and fixed by the engagement means.

Figure 2:
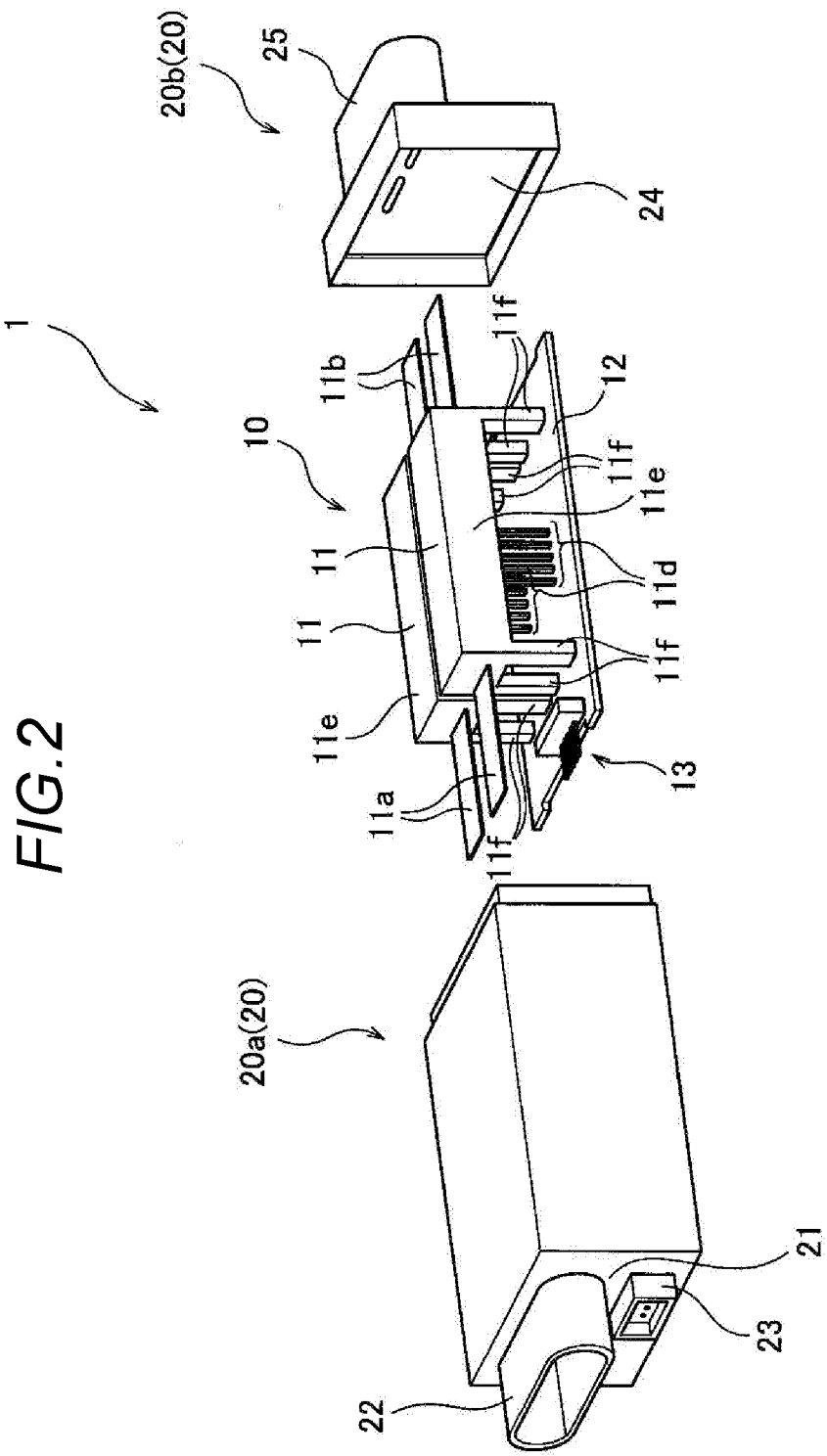
FIG. 2 is an exploded perspective view of the connector module shown in FIG. 1.
Figure 3:
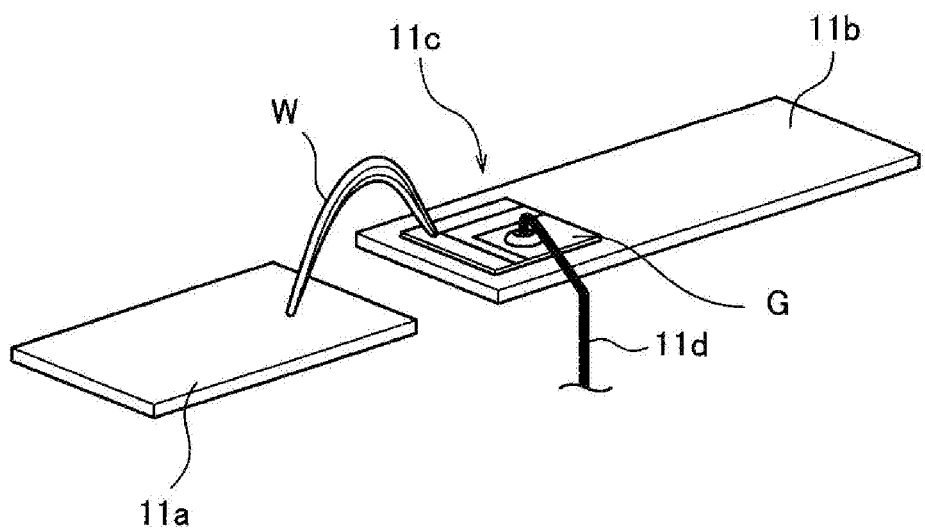
FIG. 3 is a perspective view illustrating configuration of a part of the connector module shown in FIG. 2.

FIG. 2 is an exploded perspective view of the connector module 1 shown in FIG. 1. FIG. 3 is a perspective view illustrating configuration of a part of the connector module 1 shown in FIG. 2. As shown in FIGS. 2 and 3, the connector module 1 is constituted of a housed component 10 and a case member 20 housing the housed component 10 therein. The housed component 10 is constituted of semiconductor modules (electronic components) 11, a control board 12 and signal input terminals 13.

As shown in FIGS. 2 and 3, each of the semiconductor modules 11 is constituted of first and second bus bars 11a, 11b each formed by a metal plate, power devices (heat generation elements, semiconductor elements) 11c, control terminals 11d each configured by a conductive member, and an insulative resin member 11e for molding these constituent elements. The resin member 11e packages the power devices 11c.

The resin member 11e has a rectangular shape in its plan view (top view). Four legs 11f, extending toward the control board 12 from respective four corners of the rectangular shaped resin member, are integrally formed with the resin member. The semiconductor module 11, except for these legs 11f, is placed in a floated state from the control board 12 by these legs 11f.

The power device 11c is disposed between the first and second bus bars 11a, 11b. The power device is controlled so as to be turned on/off, thereby conducting/interrupting between the first and second bus bars 11a, 11b. The power device 11c is, for example, an MOSFET which is mounted on the bus bar 11b via die bonding material and formed by material such as Si, SiC or GaN. As shown in FIG. 3, the power device 11c has agate electrode G connected to one end of the control terminal 11d, a source electrode connected to one end of a source wire W, and a drain electrode connected to the second bus bar 11b. The other end of the control terminal 11d is connected to the control board 12, and the other end of the source wire W is connected to the first bus bar 11a.

The control board 12 mounts the semiconductor modules 11 and forms a predetermined circuit. The control board transmits an on/off signal to the gate electrode G of the power device 11c via the control terminal 11d so as to perform the on/off control of the power device 11c.

The signal input terminals 13 are provided on the control board 12 and receive control signals representing on/off control of the respective power devices 11c. The control board 12 transmits the on/off signals to the gate electrodes G of the power devices 11c via the control terminals 11d based on the control signals inputted from the signal input terminals 13, respectively.

In the example shown in FIG. 2, the two semiconductor modules 11 are arranged in parallel. This is because one of the semiconductor modules is arranged on a positive electrode side and the other is arrange on a negative electrode side on the path flowing the large current. In this manner, the connector module 1 according to the first embodiment is configured to house both the paths on the positive electrode side and the negative electrode side.

Further, in the example shown in FIG. 2, the five control terminals 11d are provided for each of the semiconductor modules 11. That is, in the example shown in FIG. 1, each of the first and second bus bars 11a, 11b is branched into five (plural) paths within the single semiconductor module 11, and the power device 11c is provided for each of the branched paths. The control board 12 transmits the on/off signal to each of the control terminals 11d, thereby turning on/off the five (plural) power devices 11c in response to the respective on/off signals. In this manner, the large current is branched into the plural paths so as to cope with a rated current of the power device 11c.

In the first embodiment, the plural control terminals 11d are provided for each of the semiconductor modules 11 and the plural control terminals 11d serve to perform the on/off control of the respective plural power devices on the brunched paths, but the invention is not limited thereto. For example, the source and drain terminals of the FET may be incorporated in the control board 12 so that control of failure detection of the FET, current detection utilizing an on-resistance of the FET, etc. can be performed.

The case member 20 is formed by an insulative resin member and constituted of a first case member 20a and a second case member 20b. The first case member 20a is a cylindrical member having a closed one end. Each of the first bus bars 11a and the signal input terminals 13 is partially protruded and exposed from one end wall 21 on the one end side of the first case member. First and second connector parts 22, 23 respectively covering the exposed circumferential peripheries of the first bus bars 11a and the signal input terminals 13 are formed at the one end wall 21. The first and second connector parts 22, 23 are connected to counterpart connectors, respectively. Each of the first and second connector parts is integrally formed with the one end wall 21 in a protrusive manner therefrom. Although not shown, each of the first and second connector parts 22, 23 is provided with a retaining mechanism (a locking arm, a locking projection, a locking hole or the like).

The second case member 20b is a 11d member provided on the other end side of the cylindrical first case member 20a. Each of the second bus bars 11b is partially protruded and exposed from the other end wall 24 of the second case member on the other end side. A third connector part 25 covering the exposed circumferential peripheries of the second bus bars 11b is formed at the other end wall 24. The third connector part 25 is connected to a counterpart connector and is integrally formed with the other end wall 24 in a protrusive manner therefrom. Although not shown, the third connector part 25 is also provided with a retaining mechanism (a locking arm, a locking projection, a locking hole or the like).

Figure 4:
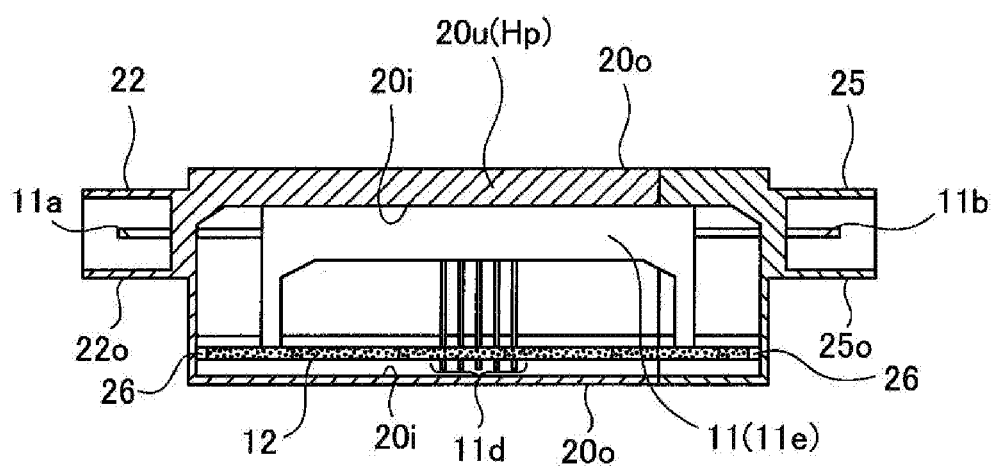
FIG. 4 is a sectional view of the connector module shown in FIG. 1.
Figure 5:
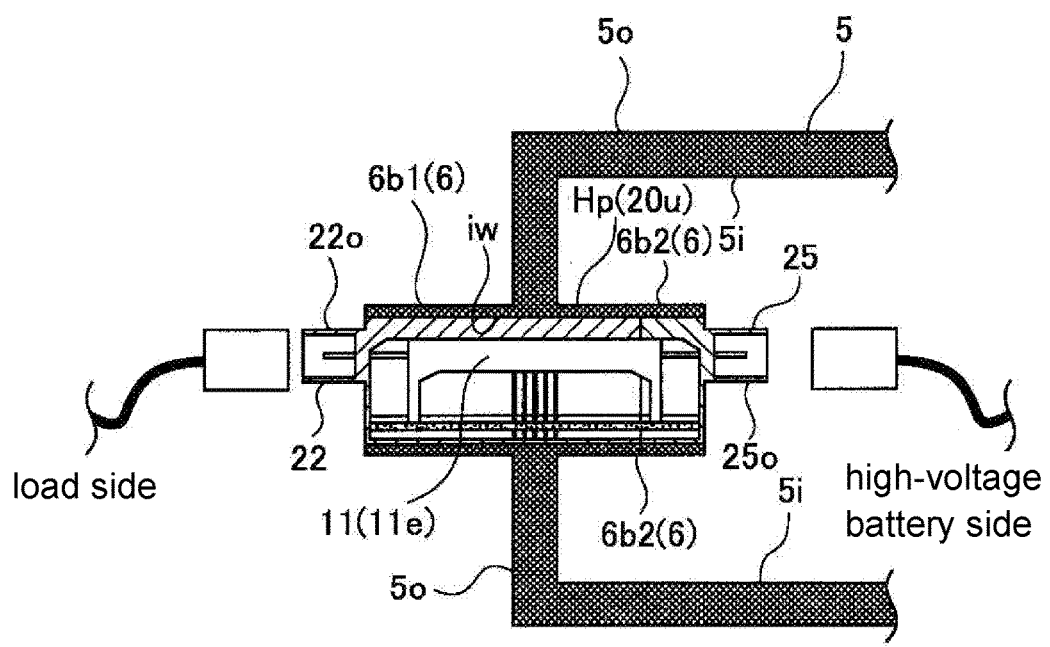
FIG. 5 is a sectional view showing the heat dissipation structure for the connector module shown in FIG. 1, in a state where the connector module is inserted and fixed in a module fixing part.

FIG. 4 is a sectional view of the connector module 1 shown in FIG. 1. FIG. 5 is a sectional view showing the heat dissipation structure Hd for the connector module 1 shown in FIG. 1, in a state where the connector module 1 is inserted and fixed in the module fixing part 6.

As also clear from FIGS. 4 and 5, the metal case 5 has a surface area larger than that of the connector module 1. The surface area of the metal case 5 means a total surface area of portions contacting the ambient air and contributing to heat dissipation. In this case, the surface area of the metal case means a sum of an area of a case outer circumferential surface 5o of the metal case and a surface area of a case outer circumferential part 6b1 of the module fixing part 6 (an inner wall iw of the module fixing part 6 is excluded because the connector module 1 is inserted and fixed therein). That is, the surface area of the metal case does not contain an area of an inner circumferential surface 5i of the metal case 5 or a surface area of a case inner circumferential part 6b2 of the module fixing part 6.

A surface area of the connector module 1 is similar to that of the metal case. That is, the surface area of the connector module 1 means a surface area of a portion contacting the ambient air and contributing to heat dissipation in a state where the connector module 1 is not inserted or fixed in the module fixing part 6. In this case, the surface area of the connector module means an area of an outer circumferential surface 20o of the case member 20. That is, this surface area does not contain an area of an inner circumferential surface 20i of the case member 20. In this embodiment, as shown in FIG. 5, as each of the connector parts 22, 23, 25 is fit into the corresponding counterpart connector in a manner of being covered thereby, the surface area does not contain circumferential surfaces of these connector parts. However, if each of the connector parts 22, 23, 25 is fit to the corresponding counterpart connector in a manner of covering the corresponding counterpart connector, the surface area also contains the outer circumferential surfaces 22o, 23o, 25o of the connector parts 22, 23, 25.

Further, in the connector module 1, as shown in FIGS. 4 and 5, the semiconductor module 11 contacts an inner surface 20*i* of an upper wall 20*u* of the case member 20, and the upper wall 20*u* constitutes a heat dissipation part Hp. In other word, heat generated from the power devices 11*c* within the semiconductor module 11 is transferred to the upper wall 20*u* via the resin member 11*e*.

In addition, the upper wall 20*u* serving as the heat dissipation part Hp directly contacts the inner wall iw of the module fixing part 6. Incidentally, the upper wall 20*u* may not directly contact this inner wall but may contact this inner wall iw of the module fixing part 6 via a heat conductive member such as a heat conductive sheet or a heat conductive resin (including adhesive). The heat conductive member is not limited to a sheet, etc. but may be an optional member having a heat conductivity almost equal to or larger than that of the upper wall 20*u*.

Next, an action of the heat dissipation structure for the connector module 1 according to the first embodiment will be explained. Firstly, a worker houses the housed component 10 within the first case member 20*a*. Then, in this state, the worker assembles the second case member 20*b* with respect to the first case member 20*a*, thereby preparing the connector module 1. As shown in FIG. 4, in this embodiment, slide grooves 26 for slidably inserting the control board 12 therein are formed at each of the first and second case members 20*a*, 20*b*. The housed component 10 is held within the case member 20 by inserting and fixing the control board 12 in the slide grooves 26.

As also shown in FIG. 2, such the connector module 1 is basically constituted of three members, that is, the housed component 10 and the case members 20. By assembling these three members, the exposed portions of the first and second bus bars 11*a*, 11*b* and signal input terminals 13 function as respective terminals of the first to third connector parts 22, 23, 25 as they are. Thus, this configuration can suppress increase of the number of the components and the number of assembling processes.

Further, in such the connector module 1, as the control board 12 is covered by the case member 20 formed by the insulative resin, the control board 12 is unlikely damaged at the time of being housed. Further, as the case member 20 is not formed by metal, the probability of short circuit of the control board can be reduced.

Next, the connector module 1 is inserted and fixed in the module fixing part 6 of the metal case 5. The connector module 1 may be, in terms of the size thereof, fixed to the module fixing part 6 or fixed by a locking means. The heat conductive member may be intervened between the heat dissipation part Hp and the module fixing part 6.

After the insertion/fixing, the first connector part 22 is fit in the counterpart connector on a load side and the third connector part 25 is fit in the counterpart connector on the high-voltage battery side. Further, the connector module 1 receives the control signal via the second connector 23 and the control board 12 transmits the on signal or the off signal to the power device 11*c*, thereby turning on or off the power device 11*c*. Upon the turning-on of the power device, the large current flows from the second bus bar 11*b* trough this power device 11*c* to the first bus bar 11*a*.

In this case, as the large current does not flow in the control board 12, it is not necessary to secure a large space for the board or a portion for installing a large connector on the board. Thus, the connector module 1 can cope with the large current and be miniaturized.

The power device 11*c* generates heat when being turned on or off. Heat is also generated when the large current flows in the bus bar 11*a* or 11*b*. The heat thus generated reaches the upper wall 20*u* (heat dissipation part Hp) of the connector module 1 via the resin member 11*e* and then reaches the module fixing part 6 from the heat dissipation part Hp. As the module fixing part 6 is a part of the metal case 5, the heat transferred to the module fixing part 6 is released to the ambient air from the metal case 5 as the member having a large surface area. Thus, the heat dissipation performance is also enhanced.

In this manner, in the heat dissipation structure Hd for the connector module 1 according to the first embodiment, the connector module 1 includes the heat dissipation part Hp constituted of the upper wall 20*u* of the case member 20 contacting the semiconductor modules 11, and the heat dissipation part Hp contacts the inner wall iw of the module fixing part 6 directly or via the heat conductive member. As a result, the heat generated from the semiconductor modules 11 is transferred to the module fixing part 6 via the heat dissipation part Hp of the connector module 1. As the module fixing part 6 is a part of the metal case 5 having the surface area larger than that of the connector module 1, the heat generated from the semiconductor modules 11 reaches the metal case 5 via the heat dissipation part Hp and the module fixing part 6 and is released from the metal case 5 having the large surface area. In this manner, as the heat generated from the semiconductor modules 11 is released from the metal case 5 having the large surface area, the heat dissipation performance can be improved. As the control board 12 is housed within the case member 20 formed by the insulative resin, the control board 12 is unlikely damaged regardless of whether or not the control board 12 is housed in the sliding manner. Further, as the case member 20 is not formed by metal, the probability of short circuit of the control board can be reduced. Accordingly, the heat dissipation structure Hd for the connector module 1, in which the control board 12 is unlikely damaged and the probability of short circuit of the control board can be reduced, can be provided.

The semiconductor module 11 includes the first and second bus bars 11*a*, 11*b*. The semiconductor module also includes, as the heat generation elements, the power devices 11*c* each of which is arranged between the first and second bus bars and conducts/interrupts between the first and second bus bars 11*a*, 11*b* by being on/off controlled. The power devices 11*c* are packaged by the resin member 11*e* which molds the power devices 11*c* and parts of the first and second bus bars 11*a*, 11*b*. The connector parts 22, 25 are integrally formed with the outer walls of the case member 20 in a protrusive manner therefrom, respectively. One end side of the first bus bar 11*a*, opposite the other end side thereof molded by the resin member 11*e*, is exposed from the case member 20 and acts as a terminal of the connector part 22. Similarly, one end side of the second bus bar 11*b*, opposite the other end side thereof molded by the resin member 11*e*, is exposed from the case member 20 and acts as a terminal of the connector part 25. Due to this configuration, each of the bus bars 11*a*, 11*b* as the members capable of coping with the large current can be used as the terminal. Further, due to this construction, as the large current does not flow in the control board 12 and hence it is not necessary to secure a large space for the board, the heat dissipation structure Hd for the connector module 1 capable of coping with the large current and realizing miniaturization can be provided.

Next, the second embodiment according to the invention will be explained. Heat dissipation structure for a connector module according to the second embodiment is substantially same as that of the first embodiment but partially differs in its configuration from the first embodiment. The different point from the first embodiment will be explained.

Figure 6:
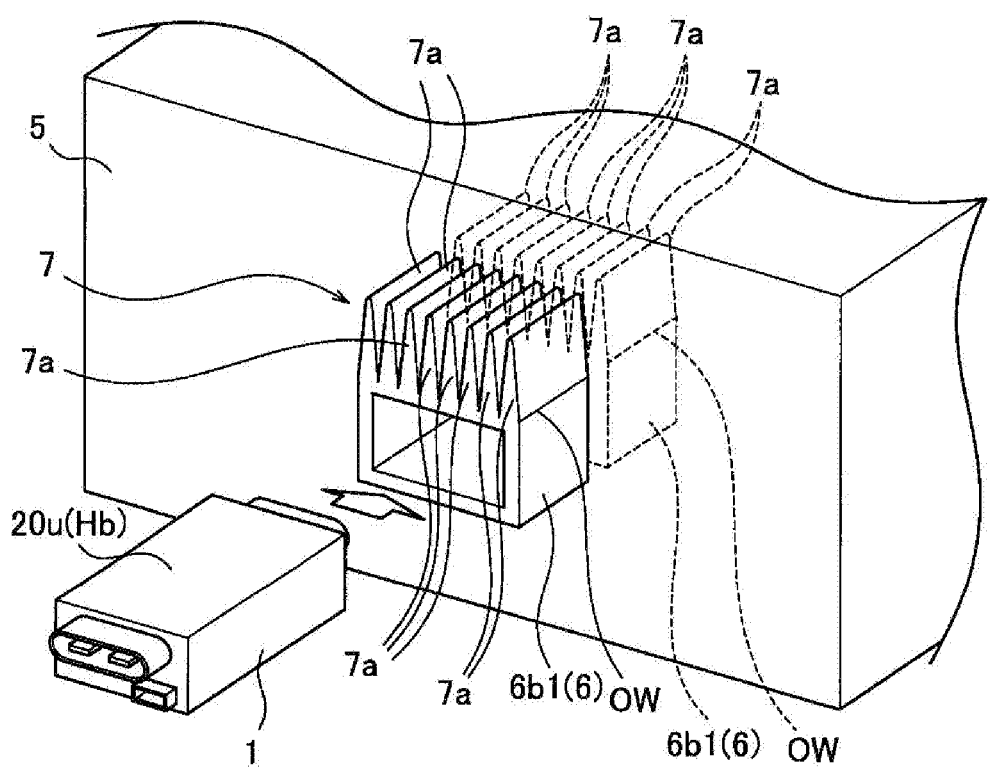
FIG. 6 is an external perspective view illustrating heat dissipation structure for a connector module according to the second embodiment.

FIG. 6 is an external perspective view illustrating the heat dissipation structure Hd for the connector module 1 according to the second embodiment. As shown in FIG. 6, in the heat dissipation structure Hd for the connector module 1 according to the second embodiment, a module fixing part 6 is provided with a heat radiation fin 7 at an outer wall ow (in particular, an upper wall) of a case outer circumferential part 6$b$1. This heat radiation fin 7 is constituted of a plurality of plate members 7$a$ extending in a vertical direction. The heat radiation fin is integrally provided with the module fixing part 6. The heat radiation fin 7 is also provided at an outer wall ow (in particular, an upper wall) of a case inner circumferential part 6$b$2.

In such the heat dissipation structure Hd for the connector module 1, heat generated from the power devices 11$c$, etc. is released from the metal case 5 having the large surface area via the upper wall 20$u$ (heat dissipation part Hp) and the module fixing part 6 and also released from the heat radiation fin 7. As the heat radiation fin 7 is provided at the upper wall of the module fixing part 6 and extends in the vertical direction, the heat radiation fin is configured to easily release heat. Further, as the heat radiation fin 7 is also provided at the outer wall ow of the case inner circumferential part 6$b$2, the heat radiation fin is configured to also release heat within the metal case 5.

In this manner, in the heat dissipation structure Hd for the connector module 1 according to the second embodiment, like the first embodiment, the heat dissipation structure Hd for the connector module 1, in which the control board 12 is unlikely damaged and the probability of short circuit of the control board can be reduced, can be provided. Further, the heat dissipation structure Hd for the connector module 1 capable of coping with the large current and realizing miniaturization can be provided.

Further, in the second embodiment, as the module fixing part 6 is provided with the heat radiation fin 7, heat transferred to the module fixing part 6 from the semiconductor module 11 is also released from the heat radiation fin 7. Thus, the heat dissipation performance can be further improved.

Next, the third embodiment according to the invention will be explained. Heat dissipation structure for a connector module according to the third embodiment is substantially same as that of the first embodiment but partially differs in its configuration from the first embodiment. The different point from the first embodiment will be explained.

Figure 7:
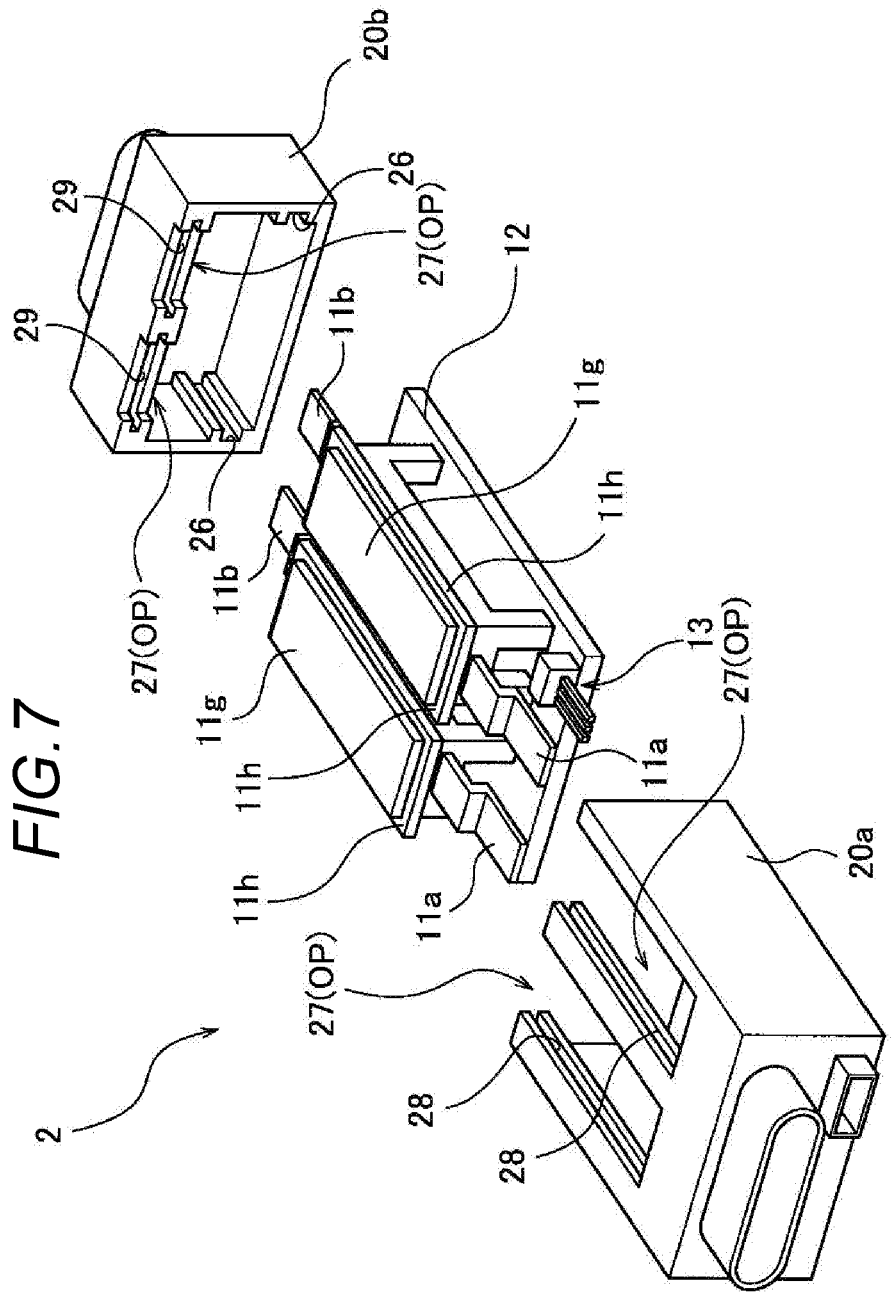
FIG. 7 is an exploded perspective view illustrating a connector module according to the third embodiment.
Figure 8:
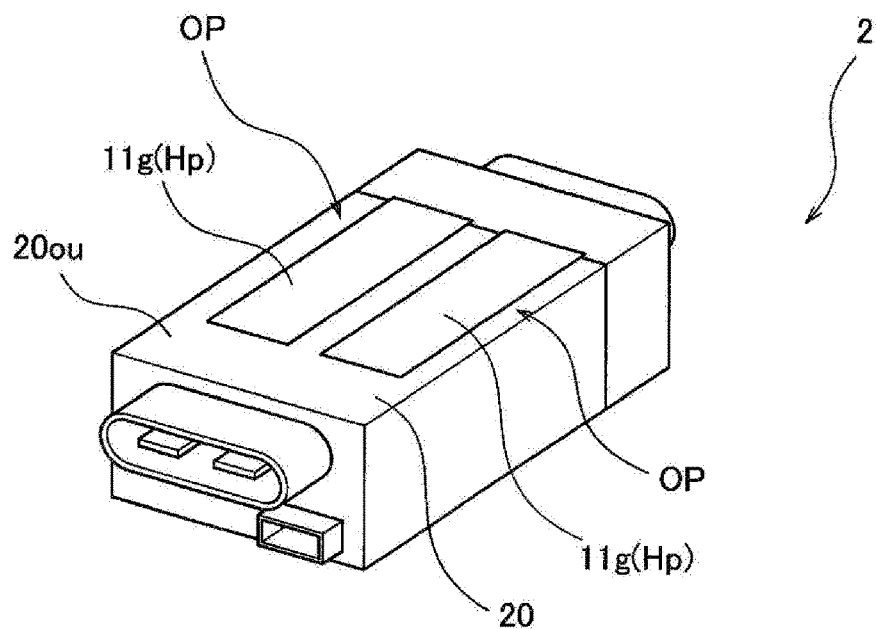
FIG. 8 is a perspective view illustrating the connector module according to the third embodiment.

FIG. 7 is an exploded perspective view illustrating the heat dissipation structure for the connector module according to the third embodiment. FIG. 8 is a perspective view illustrating the connector module according to the third embodiment. As shown in FIGS. 7 and 8, the connector module 2 according to the third embodiment includes two rectangular notches 27 at an upper wall 20$u$ of each of first and second case members 20$a$, 20$b$. In a case of assembling these case members 20$a$, 20$b$, the notches 27 of these case members match to each other and thus two rectangular openings OP are formed. Slide grooves 28 are formed at both respective edges of each of the openings OP extending to an insertion direction of the connector module 2. Also grooves 29 are formed at both respective edges of each of the openings OP extending to a direction orthogonal to the insertion direction of the connector module 2.

Further in this embodiment, each of resin members 11$e$ is constituted of an upper projection part 11$g$ protruding upward in a rectangular shape and a side projection part 11$h$ protruding laterally at a circumferential periphery of the upper projection part 11$g$. In this embodiment, as shown in FIG. 8, at a time of attaching the housed component 10 within the case member 20, the control board 12 is slidably inserted in the slide grooves 26 and simultaneously the side projection part 11$h$ is slidably inserted in the slide grooves 28. After the completion of the slidable insertion, when the second case member 20$b$ is assembled to the first case member 20$a$, the upper projection part (a part of the electronic component) 11$g$ of each of the resin members 11$e$ is exposed from the case member 20. In this case, each of the upper projection parts 11$g$ forms the same surface with an upper surface 20$ou$ of the case member 20 and constitutes the heat dissipation part Hp. In a state after the completion of the assembling, as the side projection part 11$h$ also fits into the groove 29, the semiconductor module 11 is fixed in both the insertion direction and the direction orthogonal thereto.

In such the heat dissipation structure Hd for the connector module 2, heat generated from the power devices 11$c$ is released from the metal case 5 having the large surface area via the upper projection parts 11$g$ (heat dissipation parts Hp) and the module fixing part 6. In particular, in the third embodiment, each of the upper projection parts 11$g$ as a part of the semiconductor module 11 contacts the module fixing part 6 directly or via the heat conductive member. Thus, unlike the first embodiment, as the heat is released without intervening the upper wall 20$u$, the heat dissipation performance is further enhanced.

In this manner, in the heat dissipation structure Hd for the connector module 2 according to the third embodiment, like the first embodiment, the heat dissipation structure Hd for the connector module 2, in which the control board 12 is unlikely damaged and the probability of short circuit of the control board can be reduced, can be provided. Further, the heat dissipation structure Hd for the connector module 2 capable of coping with the large current and realizing miniaturization can be provided.

Further, in the third embodiment, each of the upper projection parts 11$g$ as the part of the semiconductor module 11 contacts the module fixing part 6 directly or via the heat conductive member, without intervening the case member 20. Thus, the heat dissipation structure Hd more excellent in the heat dissipation performance can be provided.

Next, the fourth embodiment according to the invention will be explained. Heat dissipation structure for a connector module according to the fourth embodiment is substantially same as that of the first embodiment but partially differs in its configuration from the first embodiment. The different point from the first embodiment will be explained.

Figure 9:
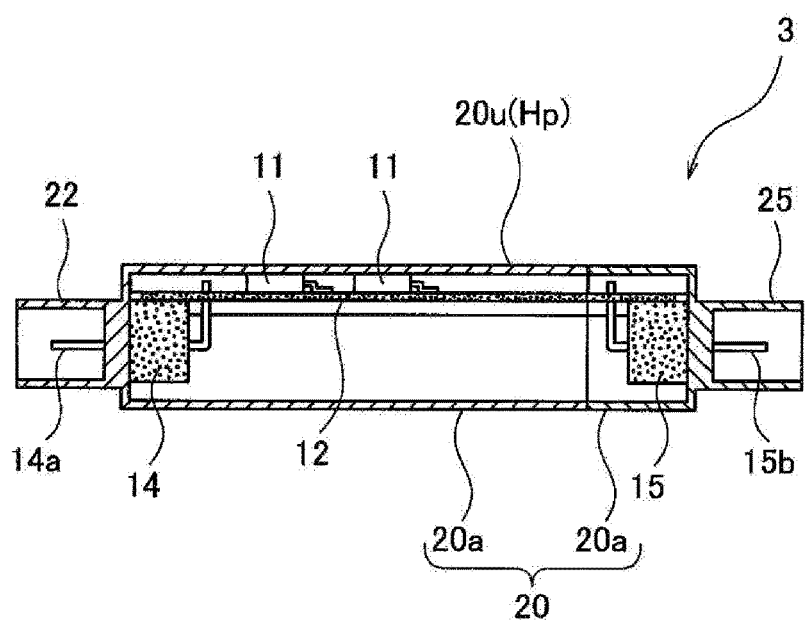
FIG. 9 is a sectional view illustrating a connector module according to the fourth embodiment.

FIG. 9 is a sectional view illustrating the connector module 3 according to the fourth embodiment. The connector module 3 shown in FIG. 9 can be used favorably with respect to a relatively small current without providing any of the first and second bus bar 11$a$, 11$b$.

Such the connector module 3 includes the control board 12 and connectors 14, 15 mounted on the control board 12. Terminals 14$a$, 15$a$ extending from the connectors 14, 15 are exposed from openings formed at the case member 20, respectively. First and third connector parts 22, 25 are integrally formed with the case member 20 so as to cover the circumferential peripheries of the respective exposed portions. Semiconductor modules 11 containing devices such as semiconductor switches (not shown in FIG. 9) are mounted on the control board 12. Further, signal input terminals (not shown) for receiving control signals from the outside and a connector (not shown) for the signal input terminals are provided on the control board 12. Each of the signal input terminals is partially exposed outside the case member 20, and a second connector (not shown) is provided so as to cover the exposed portions of the signal input terminals.

Further, the semiconductor modules 11 mounted on the control board 12 contact the upper wall 20*u* (heat dissipation part Hp) of the case member 20, thereby transferring generated heat to the upper wall 20*u* of the case member 20.

In the heat dissipation structure Hd having such the connector module 3, the control board 12 mounting the respective components 11, 14, 15, etc. is slidably inserted and housed in the first case member 20*a*, then the second case member 20*b* is assembled with the first case member, and thus the connector module 3 is prepared.

Heat generated from the semiconductor modules 11 reaches the upper wall 20*u* (heat dissipation part Hp) of the connector module 3 and then reaches the module fixing part 6 from the heat dissipation part Hp. As the module fixing part 6 is a part of the metal case 5, the heat transferred to the module fixing part 6 is released to the ambient air from the metal case 5 as the member having a large surface area. Thus, the heat dissipation performance is also enhanced.

In this manner, in the heat dissipation structure Hd for the connector module 3 according to the fourth embodiment, like the first embodiment, the heat dissipation structure Hd for the connector module 3, in which the control board 12 is unlikely damaged and the probability of short circuit of the control board can be reduced, can be provided.

Further, in the fourth embodiment, the heat dissipation structure Hd for the connector module 3, which can be used favorably with respect to a relatively small current without providing any of the first and second bus bar 11*a*, 11*b*, can be provided.

An explanation has been given of the invention based on the embodiments, but the invention is not limited to the embodiments. That is, various changes may be made within a range not departing from the gist of the invention and the techniques describe in the embodiments may be combined suitably in a possible range.

For example, in the embodiments described above, although the power device 11*c* is exemplarily used as the heat generation element, the heat generation element is not limited thereto but another heat generation element such as a fuse or a relay may be employed. Further, although the MOSFET is exemplarily used as the power device 11*c*, another semiconductor element capable of being turned on/off such as a transistor may be employed. Furthermore, in the semiconductor module 11, although the power device 11*c* is packaged by molding the power device 11*c* with the resin member 11*e*, the packaging is not limited thereto but may be performed by merely covering the power device with a box-shaped member.

Further, in the embodiments described above, although each of the connector modules 1, 2 includes the source wire W extending to the first bus bar 11*a* from the source electrode of the power device 11*c*, the invention is not limited thereto. For example, the source wire W may be eliminated by directly connecting the first bus bar 11*a* to the source electrode.

Further, in each of the heat dissipation structures Hd according to the embodiments described above, although the module fixing part 6 is provided at the metal case 5, the module fixing part is not necessarily provided at the metal case but may be provided at another metal member such as a metal plate. Further, in each of the connector modules 1, 2 according to the embodiments described above, other components such as a fuse may be mounted on the first and second bus bars 11*a*, 11*b*.

In addition, in the embodiments described above, although the first connector part 22 and the third connector part 25 protrude in the opposite directions with respect to the case member 20, the protrusion direction is not limited thereto. For example, the first and third connector parts may protrude in directions perpendicular to each other.

Further, in the embodiments described above, although the first connector part 22 and the second connector part 23 protrude in the same direction with respect to the case member 20, the protrusion direction is not limited thereto. For example, the first and second connector parts may protrude in different directions to each other. Although the second connector part is not shown in the fourth embodiment, the second connector part may be arranged in the fourth embodiment in the same manner as the other embodiments. In a case where the first and second connector parts protrude in the same direction, the counterpart connectors are not connected in three directions but connected in two directions with respect to each of the connector modules 1 to 3. Thus, the connection directions can be limited to two directions. In contrast, in a case where the first and second connector parts protrude in the different directions to each other, in particular, in a case where all the connector parts 22, 23, 25 protrude in the different directions to each other, the counterpart connectors are connected in three directions with respect to each of the connector modules 1 to 3. Thus, each of the connector parts 22, 23, 25 can be fit into the corresponding one of the counterpart connectors in a manner of being unlikely interfered by the others of the connector parts 22, 23, 25, etc.

Figure 10:
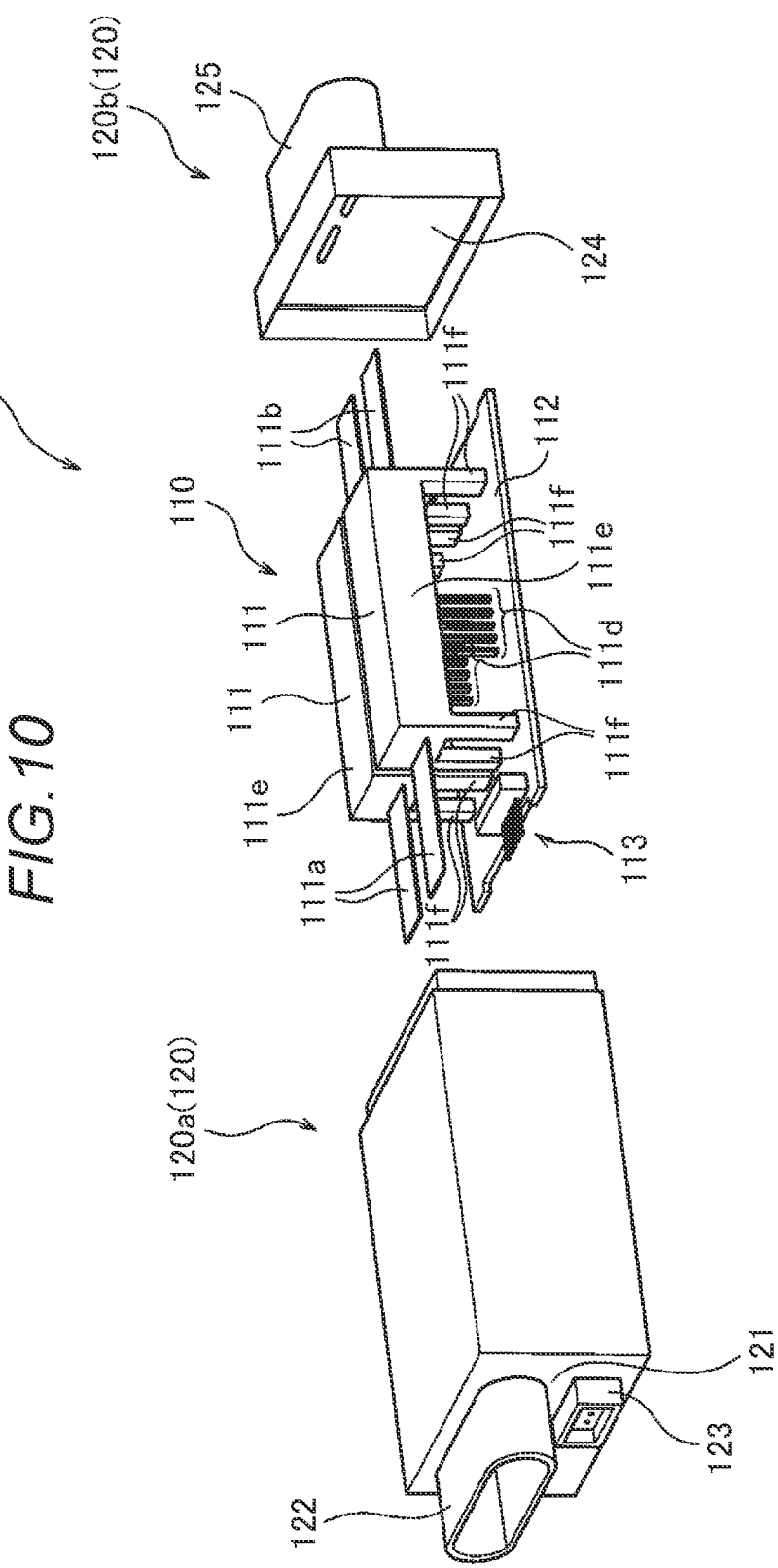
FIG. 10 is an exploded perspective view illustrating a connector module according to the fifth embodiment.
Figure 11:
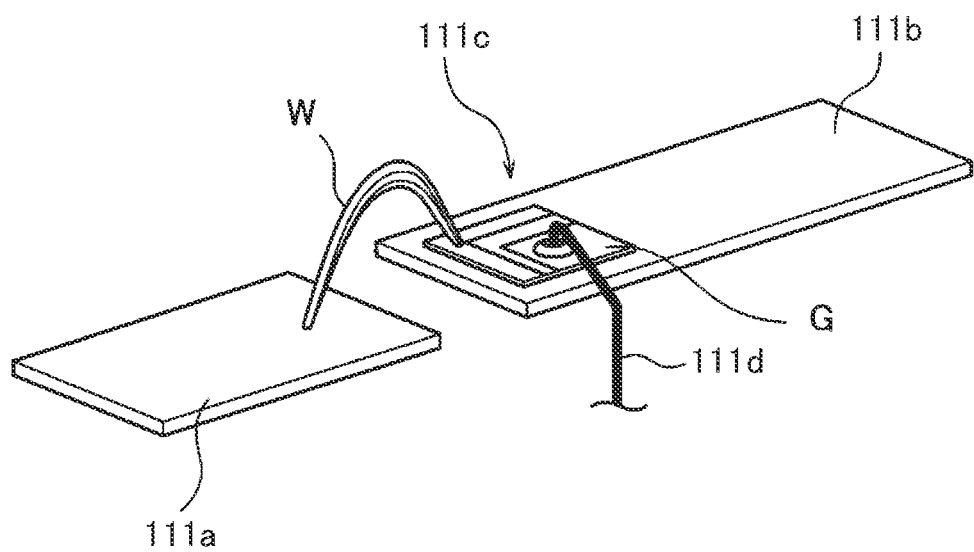
FIG. 11 is a perspective view illustrating configuration of a part of the connector module shown in FIG. 10.

FIG. 10 is an exploded perspective view illustrating a connector module according to the fifth embodiment of the invention. FIG. 11 is a perspective view illustrating configuration of a part of the connector module shown in FIG. 10. As shown in FIG. 10, the connector module 101 is provided, for example, on a path flowing a large current and constituted of a housed component 110 and a case member 120 housing the housed component 110 therein. The housed component 110 is constituted of semiconductor modules 111, a control board 112 and signal input terminals 113.

As shown in FIGS. 10 and 11, each of the semiconductor modules 111 is constituted of first and second bus bars 111*a*, 111*b* each formed by a metal plate, power devices (semiconductor elements) 111*c*, control terminals 111*d* each configured by a conductive member and an insulative resin member 111*e* for molding these constituent elements.

The resin member 111*e* has a rectangular shape in its plan view (top view). Four legs 111*f*, extending toward the control board 112 from respective four corners of the rectangular shaped resin member, are integrally formed with the resin member. The semiconductor module 111, except for these legs 111*f*, is placed in a floated state from the control board 112 by these legs 111*f*.

The power device 111*c* is disposed between the first and second bus bars 111*a*, 111*b*. The power device is controlled so as to be turned on/off, thereby conducting/interrupting between the first and second bus bars 111*a*, 111*b*. The power device 111*c* is, for example, an MOSFET which is mounted on the bus bar 111*b* via die bonding material and formed by material such as Si, SiC or GaN. As shown in FIG. 11, the power device 111*c* has a gate electrode (control electrode) G connected to one end of the control terminal 111*d*, a source electrode connected to one end of a source wire W, and a drain electrode connected to the second bus bar 111*b*. The other end of the control terminal 111*d* is connected to the control board 112, and the other end of the source wire W is connected to the first bus bar 111*a*.

The control board 112 mounts the semiconductor modules 111 and forms a predetermined circuit. The control board transmits an on/off signal to the gate electrode G of the power device 111*c* via the control terminal 111*d* so as to perform the on/off control of the power device 111*c*.

The signal input terminals 113 are provided on the control board 112 and receive the control signals instructing turning-on/off of the respective power devices 111*c*. The control board 112 transmits the on/off signals to the gate electrodes G of the power devices 111*c* via the control terminals 111*d* based on the control signals inputted from the signal input terminals 113, respectively.

In the example shown in FIG. 10, the two semiconductor modules 111 are arranged in parallel. This is because one of the semiconductor modules is arranged on a positive electrode side and the other is arranged on a negative electrode side on the path flowing the large current. In this manner, the connector module 101 according to the fifth embodiment is configured to house both the paths on the positive electrode side and the negative electrode side.

Further, in the example shown in FIG. 10, the five (plural) control terminals 111*d* are provided for each of the semiconductor modules 111. That is, in the example shown in FIG. 10, each of the first and second bus bars 111*a*, 111*b* is branched into five (plural) paths within the single semiconductor module 111, and the power device 111*c* is provided for each of the branched paths. The control board 112 transmits the on/off signal to each of the control terminals 111*d*, thereby turning on/off the five (plural) power devices 111*c* by the respective on/off signals. In this manner, the large current is branched into the plural paths so as to cope with a rated current of the power device 111*c*.

The case member 120 is formed by an insulative resin member and constituted of a first case member 120*a* and a second case member 120*b*. The first case member 120*a* is a cylindrical member having a closed one end. Each of the first bus bars 111*a* and the signal input terminals 113 is partially protruded and exposed from one end wall 121 on the one end side of the first case member. First and second connector parts 122, 123 respectively covering the exposed circumferential peripheries of the first bus bars 111*a* and the signal input terminals 113 are formed at the one end wall 121. The first and second connector parts 122, 123 are connected to counterpart connectors, respectively. Each of the first and second connector parts is integrally formed with the one end wall 121 in a protrusive manner therefrom. Although not shown, each of the first and second connector parts 122, 123 is provided with a retaining mechanism (a locking arm, a locking projection, a locking hole or the like).

The second case member 120*b* is a 11*d* member provided on the other end side of the cylindrical first case member 120*a*. Each of the second bus bars 111*b* is partially protruded and exposed from the other end wall 124 of the second case member on the other end side. A third connector part 125 covering the exposed circumferential peripheries of the second bus bars 111*b* is formed at the other end wall 124. The third connector part 125 is connected to a counterpart connector and is integrally formed with the other end wall 124 in a protrusive manner therefrom. Although not shown, the third connector part 125 is also provided with a retaining mechanism (a locking arm, a locking projection, a locking hole or the like).

Figure 12:
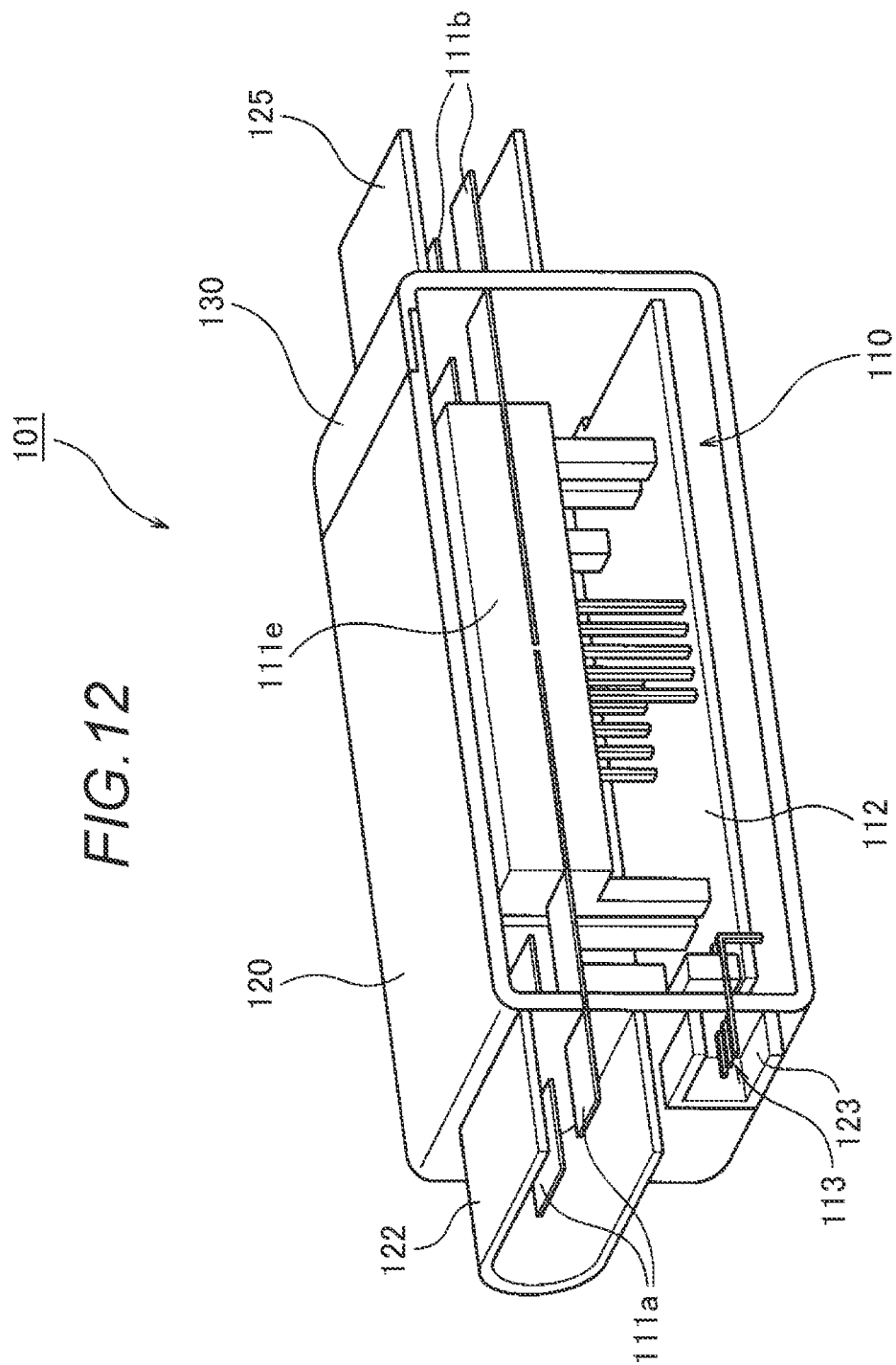
FIG. 12 is a sectional view of a connector module according to the fifth embodiment.

Next, an action of the connector module 101 according to the fifth embodiment will be explained with reference to FIG. 12. FIG. 12 is a sectional view of the connector module 101 according to this embodiment. Firstly, the housed component 110 is housed within the first case member 120*a*. Then, in this state, the second case member 120*b* is assembled to the first case member 120*a*, and thus the connector module 101 shown in FIG. 3 is prepared. Although not shown, in the fifth embodiment, slide grooves for slidably inserting the control board 112 therein are formed at each of the first and second case members 120*a*, 120*b*. The housed component 110 is held within the case member 120 by inserting and fixing the control board 112 in the slide grooves.

As also shown in FIG. 10, such the connector module 101 is basically constituted of three members, that is, the housed component 110 and the case members 120. By assembling these three members, the exposed portions of the first and second bus bars 111*a*, 111*b* and signal input terminals 113 function as respective terminals of the first to third connector parts 122, 123, 125 as they are. Thus, this configuration can suppress increase of the number of the components and the number of assembling processes.

Further, as shown in FIG. 12, in this configuration, the large current flows in the first and second bus bars 111*a*, 111*b* and the power devices 111*c* but does not flow in the control board 112. Thus, it is not necessary to secure a large space for the board. Also, the signal input terminals 113 provided on the control board 112 is not required to have a large terminal size coping with the large current. As a result, the connector module can be miniaturized.

In this manner, in the connector module 101 according to the fifth embodiment, the case member 120 is arranged to partially expose each of the first and second bus bars 111*a*, 111*b* and the signal input terminals 113 and is integrally provided with the connector parts 122, 123, 125 which respectively cover the exposed circumferential peripheries of these bus bars and signal input terminals. As the connector parts 122, 123, 125 are integrally formed with the case member 120, increase of the number of the components can be suppressed. In addition, as the connector parts 122, 123, 125 are not required to be assembled independently, increase of the number of assembling processes can also be suppressed. Further, even if the large current flows in the connector module 101, as the large current does not flow in the control board 112, it is not necessary to secure a large space for the board or a portion for installing a large connector on the board. As a result, the connector module can be miniaturized while suppressing the increase of the number of the components and the number of assembling processes.

Further, in the connector module 101 according to the fifth embodiment, in a case of applying this connector module to an EV (electric vehicle) or an HEV (hybrid electric vehicle), a high-voltage system and a low-voltage system can be separated easily.

Next, the sixth embodiment according to the invention will be explained. Heat dissipation structure for a connector module according to the sixth embodiment is substantially same as that of the fifth embodiment but partially differs in its configuration from the fifth embodiment. The different point from the fifth embodiment will be explained.

Figure 13:
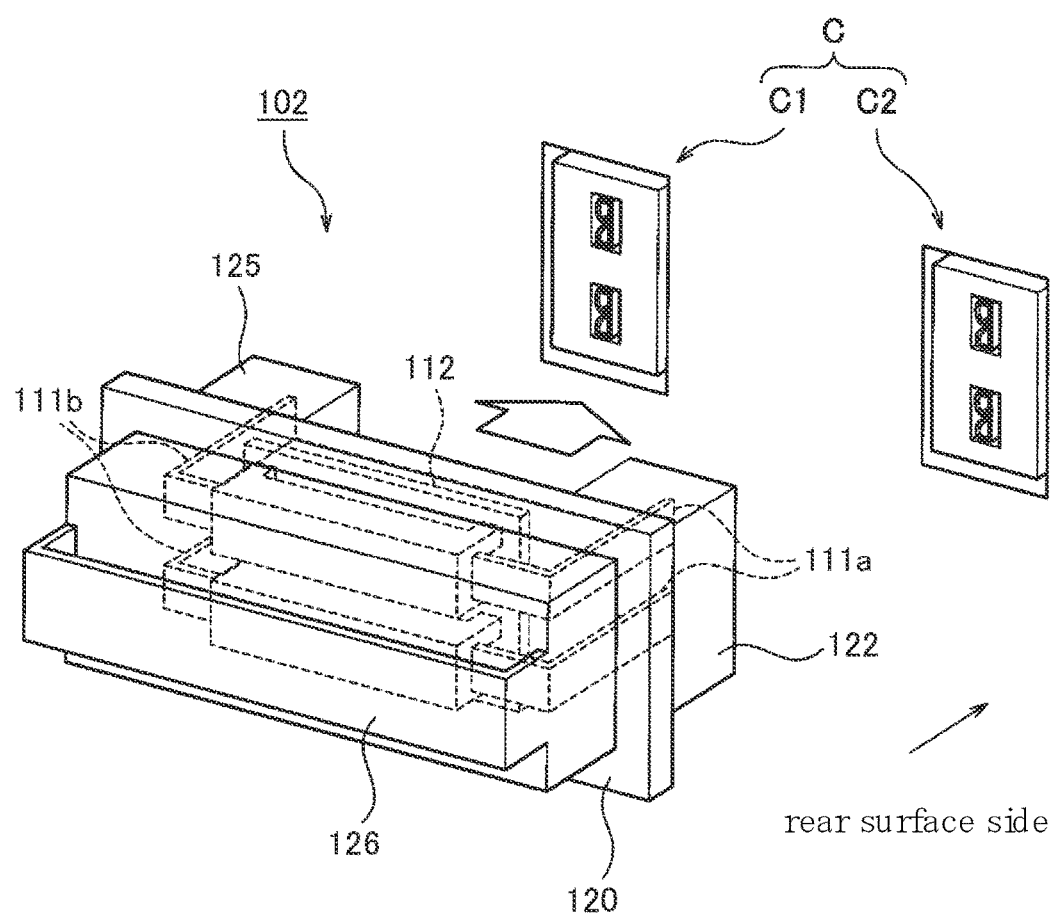
FIG. 13 is an external perspective view illustrating a connector module according to the sixth embodiment.

FIG. 13 is an external perspective view illustrating the connector module according to the sixth embodiment. In FIG. 13, for the purpose of explanation, the internal configuration of the connector module is partially shown by dotted lines.

As shown in FIG. 13, in the connector module 102 according to the sixth embodiment, first and second bus bars

111a, 111b are exposed in the same direction. In the connector module 101 according to the fifth embodiment, the first and second bus bars 111a, 111b are exposed in the opposite directions. In contrast, in the connector module 102 according to the sixth embodiment, each of the first and second bus bars 111a, 111b is bent by 90 degrees on the control board 112 side to partially expose the first and second bus bars 111a, 111b on a rear surface side of the control board 112. Thus, each of first and third connector parts 122, 125 also protrudes in this direction.

Although not shown in FIG. 13, preferably, each of signal input terminals 113 is partially exposed in this direction and a second connector part 123 extends also in this direction.

Such the connector module 102 according to the sixth embodiment can function as a so-called service plug which can be inserted into and extracted from a connector reception part C provided on a path from a battery (a high-voltage battery for travelling) to a load (a high-voltage load such as an inverter or a converter to which a high voltage is inputted from the battery). The connector reception part C includes one reception part C1 on the battery side and the other reception part C2 on the load side.

Preferably, the connector reception part C further includes a reception part for inputting control signals in correspondence to a position of the signal input terminals 113 exposed in this direction. By doing so, attachment/detachment between the connector reception part C and all the connector parts 122, 123, 125 can be performed by a single operation.

That is, the connector module 102 is operated in the same direction as the exposed direction (protrusion direction) of the first and second bus bars 111a, 111b and the signal input terminals 113 at a time of inserting into the connector reception part, whilst the connector module is operated in the opposite direction at a time of extracting from the connector reception part. In this manner, the connector module 102 can be attached to the connector reception part C only by the insertion operation (single operation) and can be detached from the connector reception part C only by the extraction operation (single operation). The insertion and extraction operations can be performed by grasping a grasping part 126 provided on one side of the control board opposite the connector reception part C, that is, on a front surface side of the control board 112.

As described above, in the connector module 102 according to the sixth embodiment, like the fifth embodiment, the connector module can be miniaturized while suppressing the increase of the number of the components and the number of assembling processes.

Further, in the sixth embodiment, the first and second bus bars 111a, 111b are exposed in the same direction. The connector module is inserted in the exposed direction and extracted in the opposite direction with respect to the connector reception part C. Thus, the connector module 102 can be used as the service plug for the high-voltage battery of an EV, an EHV or the like.

An explanation has been given of the invention based on the embodiments, but the invention is not limited to the embodiments. That is, various changes may be made within a range not departing from the gist of the invention and the techniques describe in the embodiments may be combined suitably in a possible range.

For example, although the MOSFET is exemplarily used as the power device 111c, another semiconductor element capable of being turned on/off such as a transistor may be employed. Further, at a time of the turning-on, the semiconductor element may be placed in a conductive state by being subjected to switching control such as PWM control.

Further, in each of these embodiments, although each of the connector modules 101, 102 includes the source wire W extending to the first bus bar 111a from the source electrode of the power device 111c, the invention is not limited thereto. For example, the source wire W may be eliminated by directly connecting the first bus bar 111a to the source electrode.

In each of these embodiments, the plural control terminals 111d are provided for each of the semiconductor modules 111 and the plural control terminals 111d serve to perform the on/off control of the respective plural power devices on the brunched paths, but the invention is not limited thereto. For example, the source and drain terminals of the FET may be incorporated in the control board 112 so that control of failure detection of the FET, current detection utilizing an on-resistance of the FET, etc. can be performed.

Further, each of the connector modules 101, 102 according to these embodiments may be configured to include other components such as a fuse on the path of the large current.

In the fifth embodiment, although the exposed direction of the first bus bar 111a with respect to the case member 120, that is, the protrusion direction of the first connector part 122 with respect to the case member 120 is in opposite to the exposed direction of the second bus bar 111b with respect to the case member 120, that is, the protrusion direction of the third connector part 125 with respect to the case member 120, the invention is not limited thereto but may be orthogonal to each other, for example.

Further, in the fifth embodiment, although the protrusion directions of the first and second connector parts 122, 123 with respect to the case member 120 are the same, the invention is not limited thereto but may be different to each other. In a case of the same direction, as the counterpart connectors are not connected in three directions but connected in two directions with respect to the connector module 101, the connection directions can be limited to two directions. In contrast, in a case of the different directions, in particular, in a case where all the connector parts 122, 123, 125 protrude in the different directions to each other, the counterpart connectors are connected in three directions with respect to the connector module 101. Thus, each of the connector parts 122, 123, 125 can be fit into the corresponding one of the counterpart connectors in a manner of being unlikely interfered by the others of the connector parts 122, 123, 125, etc.

Here, features of the embodiments of the connector module and the heat dissipation structure for the connector module according to the present invention described above are briefly summarized and listed as the following aspects [1] to [6].

[1] A connector module, comprising:
first and second bus bars which are respectively formed by metal plates;
a control board on which an electronic component is mounted; and
a case member which is formed by insulative resin and houses the control board therein, wherein
connector parts to be respectively connected with counterpart connectors are integrally formed with the case member.

[2] The connector module according to aspect [1], further comprising:
a semiconductor element which is arranged between the first and second bus bars and controlled to be turned on/off for conducting/interrupting between the first and second bus bars; and a signal input terminal which is provided on the control board and receives a control signal instructing turning-on/off of the semiconductor element, wherein the control board transmits an on/off signal to a control electrode of the semiconductor element so as to turn on/off the semiconductor element, the case member houses at least the semiconductor element and the control board and partially expose each of the first and second bus bars and the signal input terminal, and the connector parts are integrally formed with the case member in a manner of respectively covering exposed circumferential peripheries of the first and second bus bars and the signal input terminal.

[3] The connector module according to aspect [2], wherein the first and second bus bars are exposed in the same direction, and the connector parts covering the exposed circumferential peripheries of the first and second bus bars are inserted in an exposed direction into connector reception parts to be connected with the connector parts, and extracted in a direction opposite to the exposed direction from the connector reception parts.

[4] A heat dissipation structure for the connector module according to aspect [1], comprising:

the connector module including the control board which mounts the electronic component configured by packaging a heat generation element, the case member which is formed by the insulative resin and house the control board therein, and the connector parts to be respectively connected with the counterpart connectors; and a metal member which has a surface area larger than a surface area of the connector module and includes a module fixing part in which the connector module is inserted and fixed, wherein the connector module includes a heat dissipation part which is formed by exposing a part of the electronic component from the case member or formed by a wall of the case member which is in contact with the electronic component, and the heat dissipation part is in contact with an inner wall of the module fixing part directly or via a heat conductive member.

[5] The heat dissipation structure according to aspect [4] wherein a heat radiation fin is formed on the module fixing part.

[6] The heat dissipation structure according to one of aspects [4] or [5], wherein the connector parts are integrally formed with the case member in a manner of protruding from the case member, and one end side of each of the first and second bus bars, opposite the other end side thereof molded by the resin member, is exposed from the case member and acts as a terminal of corresponding one of the connector parts.

DESCRIPTION OF THE REFERENCE NUMERALS AND SIGNS 1-3 connector module
5 metal case (metal member)
5i inner circumferential surface
5o case outer circumferential surface
6 module fixing part
6a opening
6b frame member
6b1 case outer circumferential part
6b2 case inner circumferential part
7 heat radiation fin
7a plate member
10 housed component
11 semiconductor module (electronic component)
11a first bus bar
11b second bus bar
11c power device (heat generation element, semiconductor element)
11d control terminal
11e resin member
11f leg
11g upper projection part (part of electronic component)
11h side projection part
12 control board
13 signal input terminal
20 case member
20a first case member
20b second case member
20i inner circumferential surface
20o outer circumferential surface
20ou upper surface
20u upper wall
21 one end wall
22 first connector part
22o outer circumferential surface
23 second connector part
23o outer circumferential surface
24 the other end wall
25 third connector part
25o outer circumferential surface
26 slide groove
27 notch
28 slide groove
29 groove
G gate electrode
Hd heat dissipation structure
Hp heat dissipation part
OP opening
W source wire
iw inner wall
ow outer wall
101, 102 connector module
110 housed component
111 semiconductor module
111a first bus bar
111b second bus bar
111c power device
111d control terminal (semiconductor element)
111e resin member
111f leg
112 control board
113 signal input terminal
120 case member
121 one end wall
122, 123, 125 connector part
124 the other end wall
C connector reception part
C1, C2 reception part

What is claimed is:

1. A heat dissipation structure comprising:
a connector module; and
a metal member which has a surface area larger than a surface area of the connector module and includes a module fixing part in which the connector module is inserted and fixed, wherein the connector module comprising:

first and second bus bars which are respectively formed by metal plates;

a control board;

an electronic device in electrical communication with each of the control board, the first bus bar, and the second bus bar;

a resin member mounted on the control board, the resin member encloses the electronic device, and the resin member contains a portion of each of the first bus bar and the second bus bar;

a case member which defines an interior and is formed by insulative resin and houses the control board and the resin member therein, the case member having an upper wall that defines an inner surface facing the interior thereof; and connector parts projecting from and integrally formed with the case member, each of the connector parts is configured to connect to a respective counterpart connector, wherein the resin member contacts the inner surface on a flat surface, or is exposed from the case member and defines a same surface with the upper wall, the electronic device is a semiconductor element controlled to be turned on/off for conducting/interrupting between the first and second bus bars and a signal input terminal is provided on the control board and receives a control signal instructing turning-on/off of the semiconductor element, the control board transmits an on/off signal to a control electrode of the semiconductor element so as to turn on/off the semiconductor element, the case member houses at least the semiconductor element and the control board and partially exposes each of the first and second bus bars and the signal input terminal, and the connector parts are integrally formed with the case member in a manner of respectively covering exposed circumferential peripheries of the first and second bus bars and the signal input terminal, wherein the connector module includes a heat dissipation part which is a part of the resin member that is exposed outside of the case member, or the heat dissipation part is a wall of the case member which is in contact with the electronic component, the heat dissipation part is in contact with an inner wall of the module fixing part directly or via a heat conductive member, the connector parts are integrally formed with the case member in a manner of protruding from the case member, one end side of each of the first and second bus bars, opposite the other end side thereof molded by the resin member, is exposed from the case member and acts as a terminal of corresponding one of the connector parts, and one of the electronic devices is arranged on a positive electrode side and the other of the electronic devices is arranged on a negative electrode side on a path flowing current.

2. The heat dissipation structure according to claim 1, wherein a heat radiation fin is formed on the module fixing part.

3. The heat dissipation structure according to claim 1, wherein the first and second bus bars are exposed in the same direction, and the connector parts covering the exposed circumferential peripheries of the first and second bus bars are inserted in an exposed direction into connector reception parts to be connected with the connector parts, and extracted in a direction opposite to the exposed direction from the connector reception parts.

* * * * *